(12) United States Patent
Hagleitner et al.

(10) Patent No.: US 8,563,372 B2
(45) Date of Patent: Oct. 22, 2013

(54) METHODS OF FORMING CONTACT STRUCTURES INCLUDING ALTERNATING METAL AND SILICON LAYERS AND RELATED DEVICES

(75) Inventors: Helmut Hagleitner, Zebulon, NC (US);
Zoltan Ring, Chapel Hill, NC (US);
Scott Sheppard, Chapel Hill, NC (US);
Jason Henning, Carrboro, NC (US);
Jason Gurganus, Raleigh, NC (US);
Dan Namishia, Louisburg, NC (US)

(73) Assignee: Cree, Inc., Durham, NC (US)

( * ) Notice: Subject to any disclaimer, the term of this patent is extended or adjusted under 35 U.S.C. 154(b) by 403 days.

(21) Appl. No.: 12/704,013

(22) Filed: Feb. 11, 2010

(65) Prior Publication Data

US 2011/0193135 A1    Aug. 11, 2011

(51) Int. Cl.
*H01L 21/338*    (2006.01)
(52) U.S. Cl.
USPC ................................ 438/172; 257/194
(58) Field of Classification Search
USPC ................................ 438/172; 257/194
See application file for complete search history.

(56) References Cited

U.S. PATENT DOCUMENTS

| | | | |
|---|---|---|---|
| 4,946,547 A | 8/1990 | Palmour et al. | |
| 5,192,987 A | 3/1993 | Khan et al. | |
| 5,200,022 A | 4/1993 | Kong et al. | |
| 5,210,051 A | 5/1993 | Carter, Jr. | |
| 5,296,395 A | 3/1994 | Khan et al. | |
| 5,355,020 A | 10/1994 | Lee et al. | |
| RE34,861 E | 2/1995 | Davis et al. | |
| 5,393,993 A | 2/1995 | Edmond et al. | |
| 5,523,589 A | 6/1996 | Edmond et al. | |
| 6,218,680 B1 | 4/2001 | Carter, Jr. et al. | |
| 6,316,793 B1 | 11/2001 | Sheppard et al. | |
| 6,548,333 B2 * | 4/2003 | Smith | 438/172 |
| 7,544,963 B2 | 6/2009 | Saxler | |
| 7,548,112 B2 | 6/2009 | Sheppard | |
| 7,592,211 B2 | 9/2009 | Sheppard et al. | |
| 2005/0277290 A1 | 12/2005 | Yang et al. | |
| 2006/0192194 A1 | 8/2006 | Erchak et al. | |
| 2006/0244010 A1 | 11/2006 | Saxler | |
| 2006/0251800 A1 | 11/2006 | Weidman et al. | |
| 2007/0018210 A1 | 1/2007 | Sheppard | |
| 2007/0164322 A1 | 7/2007 | Smith et al. | |

(Continued)

OTHER PUBLICATIONS

Roman, William "Development of AlGaN/GaN HEMT Technology for Highest Frequency Operation: An Undergraduate Research Experience at the Forshungszentrum Jülich (Germany)", Trip report presented at the NSF IREE 2008 Grantees Conference, May 2008, Washington, D.C. pp. 164-165.*

(Continued)

*Primary Examiner* — Jae Lee
*Assistant Examiner* — Grant Withers
(74) *Attorney, Agent, or Firm* — Myers Bigel Sibley & Sajovec, P.A.

(57) ABSTRACT

A method of forming a semiconductor device, the method comprising providing a semiconductor layer, and providing a first layer of a first metal on the semiconductor layer. A second layer may be provided on the first layer of the first metal. The second layer may include a layer of silicon and a layer of a second metal, and the first and second metals may be different. The first metal may be titanium and the second metal may be nickel. Related devices, structures, and other methods are also discussed.

30 Claims, 3 Drawing Sheets

(56) References Cited

U.S. PATENT DOCUMENTS

| | | | |
|---|---|---|---|
| 2008/0116464 A1* | 5/2008 | Ward et al. | 257/77 |
| 2009/0244423 A1 | 10/2009 | Hirakata et al. | |
| 2010/0219394 A1* | 9/2010 | Jiang et al. | 257/13 |

OTHER PUBLICATIONS

Pecz, B. "TEM study of Ni and Ni2Si ohmic contacts to SiC" Diamond and Related Materials vol. 6 Iss. 10 Aug. 1997 pp. 1428-1431).*

Deeb et al. ("Deeb" C. Deeb "A low-temperature route to thermodynamically stable ohmic contacts to n-type 6H-SiC" Applied Phys. Letters vol. 84, No. 7 published Feb. 16, 2004).*

Luo, B. "Improved morphology for ohmic contacts to AlGaN/GaN high electron mobility transistors using WSix- or W-based metallization" Appl. Phys. Lett. vol. 82, Num. 22 Feb. 5, 2003 pp. 3910-3912.*

Biswas, N. "Evaluation of nickel and molybdenum silicides for dual gate complementary metal-oxide semiconductor application" Appl. Phys. Lett. 86, 022105 (Apr. 1, 2005) pp. 1-3).*

Baca, A.G.("A survey of ohmic contacts to III-V compound semiconductors" Thin Solid Films vol. 308-309 Oct. 31, 1997 pp. 599-606).*

Biswas et al. "Evaluation of nickel and molybdenum silicides for dual gate complementary metal-oxide semiconductor application" *Applied Physics Letters* 86:022105-1 thru 022105-3, 2005.

Gambino et al. "Silicides and ohmic contacts" *Materials Chemistry and Physics* 52:99-146, 1998.

International Search Report and Written Opinion of the International Searching Authority for International Application No. PCT/US 11/23975; Date of mailing: Mar. 30, 2011; 8 pages.

Sheppard et al. "Improved 10-GHz Operation of GaN/AlGaN HEMTs on Silicon Carbide" *Materials Science Forum*, vols. 338-342, pp. 1643-1646, (2000).

Sheppard et al. "High Power Demonstration at 10 GHz with GaN/AlGaN HEMT Hybrid Ampifiers" Cree Inc. 4600 Silicon Drive, Durham, North Carolina, 27703, pp. 37-38, (1999).

International Preliminary Report on Patentability corresponding to PCT Application No. PCT/US2011/023975, date of mailing: Aug. 23, 2012, 6 pages.

* cited by examiner

METHODS OF FORMING CONTACT STRUCTURES INCLUDING ALTERNATING METAL AND SILICON LAYERS AND RELATED DEVICES

BACKGROUND

The present invention relates to electronic devices, and more particularly to semiconductor contact structures.

Materials such as silicon (Si) and gallium arsenide (GaAs) have found wide application in semiconductor devices for lower power and (in the case of Si) lower frequency applications. These, more familiar, semiconductor materials may not be well suited for higher power and/or high frequency applications, however, because of their relatively small bandgaps (e.g., 1.12 eV for Si and 1.42 for GaAs at room temperature) and/or relatively small breakdown voltages.

In light of the difficulties presented by Si and GaAs, interest in high power, high temperature and/or high frequency applications and devices has turned to wide bandgap semiconductor materials such as silicon carbide (2.996 eV for alpha SiC at room temperature) and the Group III nitrides (e.g., 3.36 eV for GaN at room temperature). These materials, typically, have higher electric field breakdown strengths and higher electron saturation velocities as compared to gallium arsenide and silicon.

A device of particular interest for high power and/or high frequency applications is the High Electron Mobility Transistor (HEMT), which, in certain cases, is also known as a modulation doped field effect transistor (MODFET). These devices may offer operational advantages under a number of circumstances because a two-dimensional electron gas (2 DEG) is formed at the heterojunction of two semiconductor materials with different bandgap energies, and where the smaller bandgap material has a higher electron affinity. The 2 DEG is an accumulation layer in the undoped ("unintentionally doped"), smaller bandgap material and can contain a very high sheet electron concentration in excess of, for example, $10^{13}$ carriers/cm$^2$. Additionally, electrons that originate in the wider-bandgap semiconductor transfer to the 2 DEG, allowing a high electron mobility due to reduced ionized impurity scattering.

This combination of high carrier concentration and high carrier mobility can give the HEMT a very large transconductance and may provide a strong performance advantage over metal-semiconductor field effect transistors (MESFETs) for high-frequency applications.

High electron mobility transistors fabricated in the gallium nitride/aluminum gallium nitride (GaN/AlGaN) material system have the potential to generate large amounts of RF power because of the combination of material characteristics that includes the aforementioned high breakdown fields, their wide bandgaps, large conduction band offset, and/or high saturated electron drift velocity. A major portion of the electrons in the 2 DEG is attributed to polarization in the AlGaN. HEMTs in the GaN/AlGaN system have been demonstrated. U.S. Pat. Nos. 5,192,987 and 5,296,395 describe AlGaN/GaN HEMT structures and methods of manufacture, the disclosures of which are incorporated herein by reference. U.S. Pat. No. 6,316,793, to Sheppard et al., which is commonly assigned and is incorporated herein by reference, describes a HEMT device having a semi-insulating silicon carbide substrate, an aluminum nitride buffer layer on the substrate, an insulating gallium nitride layer on the buffer layer, an aluminum gallium nitride barrier layer on the gallium nitride layer, and a passivation layer on the aluminum gallium nitride active structure.

In HEMT and other semiconductor devices, relatively low resistance ohmic contacts may be desired, for example, to accommodate relatively high current operation, to reduce generation of heat, etc. Conventional source/drain contacts used in HEMT devices, for example, may be subject to degradation due to chemical attack during subsequent fabrication operations and/or adhesion problems during use. Accordingly, there continues to exist a need in the art for improved ohmic contact structures and methods of fabrication for HEMT and other semiconductor devices.

SUMMARY

According to some embodiments of the present invention, a method of forming a semiconductor device may include providing a semiconductor layer, and providing a first layer of a first metal on the semiconductor layer. A second layer may be provided on the first layer of the first metal. The second layer may include a layer of silicon and a layer of a second metal, and wherein the first and second metals are different. For example, the first metal may be titanium and the second metal may be nickel. Moreover, the layer of silicon may be between the layer of the second metal and the first layer of the first metal.

Providing the layer of silicon may include providing at least two layers of silicon, and providing the layer of the first metal may include providing at least one layer of nickel separating the at least two layers of silicon. The second layer including the layer of silicon and layer of the second metal may be annealed to form a silicide layer including the second metal while maintaining at least a portion of the first layer of the first metal between the silicide layer and the semiconductor layer. Moreover, the first metal may be titanium, the second metal may be nickel, and annealing the layer of silicon and the layer of the second metal comprising nickel may include annealing at a temperature that does not exceed about 500 degrees C. By maintaining the annealing temperature below about 500 degrees C., formation of titanium silicide may be reduced to thereby maintain a layer of titanium between the nickel silicide and the semiconductor layer.

Providing the second layer may include providing a plurality of alternating layers of silicon and the second metal, and all of the layers of the second metal may be separated from the first layer of the first metal by at least one of the layers of silicon. Accordingly, mixing of the first and second metals may be reduced. A metal cap layer may be provided on the second layer including the layer of silicon and the layer of the second metal, and the metal cap layer and the second metal comprise different materials. Moreover, the first metal may be titanium, the second metal may be nickel, and the metal cap layer may be at least one of platinum, palladium, and/or gold. In addition, providing the semiconductor layer may include providing a group III nitride heterojunction structure providing a 2-dimensional electron gas, and providing a doped region providing electrical coupling between the layer of the first metal and the 2-dimensional electron gas.

According to other embodiments of the present invention, a method of forming a semiconductor device may include providing a group III nitride semiconductor layer, and providing a layer of a first metal on the group III nitride semiconductor layer. A silicide layer may be provided on the layer of the first metal, and the silicide layer may include a second metal, wherein the first and second metals are different. For example, the first metal may be titanium and the second metal may be nickel.

A layer of a third metal may be provided on the silicide layer, and the third metal may be different that the first and second metals. For example, the first metal may be titanium, the second metal may be nickel, and the third metal may be at least one of platinum, palladium, and/or gold. Moreover, providing the group III semiconductor nitride layer may include providing a group III nitride heterojunction structure providing a 2-dimensional electron gas, and providing a doped region providing electrical coupling between the layer of the first metal and the 2-dimensional electron gas. The doped region may include a doped source/drain region, and a gate electrode may be formed on the semiconductor layer adjacent the layer of the first metal.

According to still other embodiments of the present invention, a semiconductor device may include a semiconductor layer and a first layer of a first metal on the semiconductor layer. In addition, a second layer may be on the first layer of the first metal. The second layer may include a layer of silicon and a layer of a second metal, and the first and second metals may be different. For example, the first metal may be titanium and the second metal may be nickel. Moreover, the layer of silicon may be between the layer of the second metal and the first layer of the first metal.

The second layer may include at least two layers of silicon and at least one layer of nickel separating the at least two layers of silicon. Moreover, all of the layers of the second metal may be separated from the layer of the first metal by at least one of the layers of silicon. In addition, an atomic weight percent of silicon in the second layer may be in the range of about 45 percent to about 55 percent.

A metal cap layer may be on the second layer with a metal of the metal cap layer being different than the first and second metals. For example, the first metal may be titanium, the second metal may be nickel, and the metal cap layer may be at least one of platinum, palladium, and/or gold. Moreover, the semiconductor layer may include a group III nitride heterojunction structure providing a 2-dimensional electron gas, and a doped region providing electrical coupling between the layer of the first metal and the 2-dimensional electron gas.

According to still other embodiments of the present invention, a semiconductor device may include a group III nitride semiconductor layer, and a layer of a first metal on the group III nitride semiconductor layer. A silicide layer may be on the layer of the first metal, and the silicide layer may include a second metal with the first and second metals being different. For example, the first metal may be titanium and the second metal may be nickel. In addition, a layer of a third metal may be on the silicide layer with the third metal being different than the first and second metals. For example, the first metal may be titanium, the second metal may be nickel, and the third metal may be at least one of platinum, palladium, and/or gold.

The group III nitride semiconductor layer may include a group III nitride heterojunction structure providing a 2-dimensional electron gas, and a doped region providing electrical coupling between the layer of the first metal and the 2-dimensional electron gas. Moreover, an atomic weight percent of silicon in the silicide layer may be in the range of about 45 percent to about 55 percent.

DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION

Figure 1:
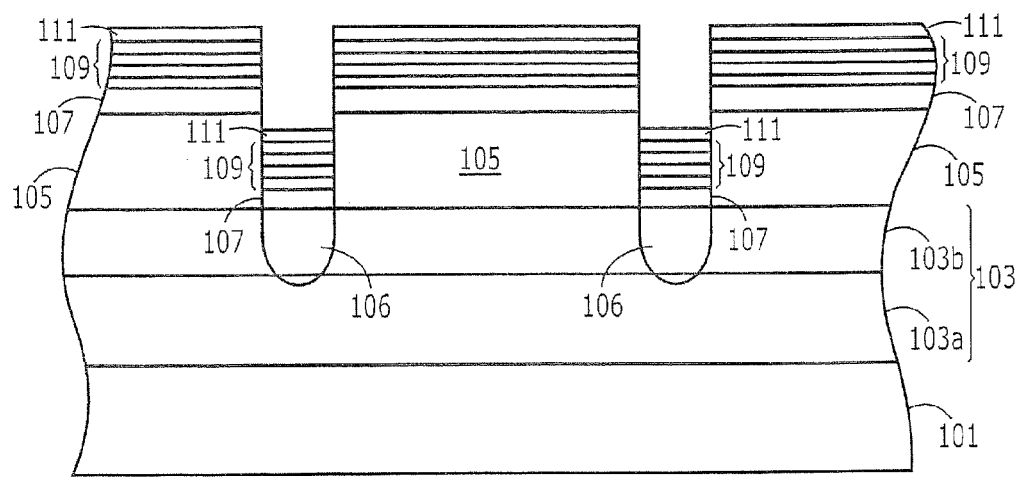
FIGS. 1 to 4 are cross sectional views illustrating operations of forming ohmic contact structures according to some embodiments of the present invention.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below," "above," "upper," "lower," "horizontal," "lateral," "vertical." "beneath," "over," "on," etc., may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Some embodiments of the invention are described with reference to semiconductor layers and/or regions which are characterized as having a conductivity type such as n type or p type, which refers to the majority carrier concentration in the layer and/or region. Thus, N type material has a majority equilibrium concentration of negatively charged electrons, while P type material has a majority equilibrium concentration of positively charged holes. Some material may be designated with a "+" or "−" (as in $N^+$, $P+$, $P^-$, $N^{++}$, $N^{--}$, $P^{++}$, $P^{--}$, or the like), to indicate a relatively larger ("+") or smaller ("−") concentration of majority carriers compared to another layer or region. However, such notation does not imply the existence of a particular concentration of majority or minority carriers in a layer or region.

Silicon carbide (SiC) substrates/layers discussed herein may be 4H polytype silicon carbide substrates/layers. Other silicon carbide candidate polytypes, such as 3C, 6H, and 15R polytypes, however, may be used. Appropriate SiC substrates are available from Cree Research, Inc., of Durham, N.C., the assignee of the present invention, and the methods for producing such substrates are set forth in the scientific literature as well as in a number of commonly assigned U.S. patents, including but not limited to U.S. Pat. No. Re. 34,861, U.S. Pat. No. 4,946,547, and U.S. Pat. No. 5,200,022, the disclosures of which are incorporated herein in their entirety by reference.

As used herein, the term "Group III nitride" refers to those semiconducting compounds formed between nitrogen and one or more elements in Group III of the periodic table, usually aluminum (Al), gallium (Ga), and indium (in). The term also refers to binary, ternary, and quaternary compounds such as GaN, AlGaN and AlInGaN. The Group III elements can combine with nitrogen to form binary (e.g., GaN), ternary (e.g., AlGaN), and quaternary (e.g., AlInGaN) compounds. These compounds may have empirical formulas in which one mole of nitrogen is combined with a total of one mole of the Group III elements. Accordingly, formulas such as $Al_xGa_{1-x}N$ where $1>x>0$ are often used to describe these compounds. Techniques for epitaxial growth of Group III nitrides have become reasonably well developed and reported in the appropriate scientific literature, and in commonly assigned U.S. Pat. No. 5,210,051, U.S. Pat. No. 5,393,993, and U.S. Pat. No. 5,523,589, the disclosures of which are hereby incorporated herein in their entirety by reference.

A contact structure for a semiconductor device may provide ohmic contact with an underlying semiconductor material. In a Group III nitride semiconductor device, such as a High Electron Mobility Transistor (HEMT), a source/drain contact may provide ohmic contact with a 2 Dimensional Electron Gas (2 DEG) in a Group III nitride semiconductor material(s) such as gallium nitride (GaN), aluminum gallium nitride, indium gallium nitride, indium nitride, indium aluminum nitride, and/or indium gallium aluminum nitride. While aluminum-nickel structures may provide ohmic contact with Group III nitride semiconductor materials, an aluminum-nickel structure may be subject to galvanic corrosion, chemical attack during subsequent etching, and/or adhesion problems.

According to some embodiments of the present invention, a source/drain contact for a semiconductor layer may include a layer of a first metal on the semiconductor layer and a silicide layer including a second metal (i.e., a silicide of the second metal) on the layer of the first metal, with the first and second metals being different. For example, the first metal may be titanium and/or any other suitable metal, and the second metal may be nickel and/or any other suitable metal. More particularly, alternating layers of silicon and the second metal may be formed on the layer of the first metal and then annealed to form the silicide layer. In addition, a layer of a third metal may be formed on the alternating layers of silicon and the second metal before annealing to thereby reduce oxidation of the contact structure. The third metal may be gold, platinum, palladium, and/or any other suitable metal. The resulting ohmic contact structure may be chemically stable and/or corrosion resistant, and/or may provide a low resistance contact with the underlying semiconductor layer while maintaining adhesion with the underlying semiconductor layer over a useful life of the device.

FIGS. 1 to 4 are cross sectional views illustrating operations of forming ohmic contact structures according to embodiments of the present invention. As shown in FIG. 1, a semiconductor structure 103, such as a semiconductor structure for a Group III nitride semiconductor HEMT (High Electron Mobility Transistor), may be formed on a substrate 101 such as a silicon carbide SiC substrate or a sapphire substrate. The substrate 101 may be a semi-insulating silicon carbide (SiC) substrate that may be, for example, the 4H polytype of silicon carbide. Other silicon carbide candidate polytypes may include the 3C, 6H, and 15R polytypes. The substrate may be a High Purity Semi-Insulating (HPSI) substrate, available from Cree, Inc. The term "semi-insulating" is used descriptively herein, rather than in an absolute sense.

In some embodiments of the present invention, the silicon carbide bulk crystal may have a resistivity equal to or higher than about $1 \times 10^5$ ohm-cm at room temperature. Exemplary SiC substrates that may be used in some embodiments of the present invention are manufactured by, for example, Cree, Inc., of Durham, N.C., the assignee of the present invention, and methods for producing such substrates are described, for example, in U.S. Pat. No. Re. 34,861, U.S. Pat. No. 4,946,547, U.S. Pat. No. 5,200,022, and U.S. Pat. No. 6,218,680, the disclosures of which are incorporated by reference herein in their entireties. Similarly, techniques for epitaxial growth of Group III nitrides have been described in, for example, U.S. Pat. No. 5,210,051, U.S. Pat. No. 5,393,993, and U.S. Pat. No. 5,523,589, the disclosures of which are also incorporated by reference herein in their entireties.

Semiconductor structure 103 may include a channel layer 103a and a barrier layer 103b formed of Group III nitride semiconductor materials having different bandgaps, such that an interface between the channel layer 103a and the barrier layer 103b defines a heterojunction. Channel layer 103a may be a Group III-nitride layer, such as GaN. Channel layer 103a may also include other Group III-nitride layers, such as indium gallium nitride (InGaN), aluminum indium gallium nitride (AlInGaN), or the like. Channel layer 103a may be undoped (i.e., "unintentionally doped"), and may be grown to a thickness of greater than about 20 Angstroms. Channel layer 103a may also be a multi-layer structure, such as a superlattice or combinations of GaN, AlGaN, or the like.

Barrier layer 103b may be a Group III-nitride layer, such as $Al_xGa_{1-x}N$ (where $0<x<1$). The barrier layer 103b may also include other Group III-nitride layers, such as AlInGaN, AlN, and/or combinations of layers thereof. Barrier layer 103b may, for example, be from about 0.1 nm to about 100 nm thick, but may be thin enough to reduce substantial cracking and/or defect formation therein. In some embodiments of the present invention, the barrier layer 103b may be a highly-doped n-type layer. For example, the barrier layer 103b may be doped to a concentration of about $10^{19}$ $cm^{-3}$. While semiconductor structure 103 is shown with channel layer 103a and barrier layer 103b for purposes of illustration, semiconductor structure 103 may include additional layers/structures/elements such as a buffer and/or nucleation layer(s) between channel layer 103a and substrate 101, and/or a cap layer on barrier layer 103b. HEMT structures including substrates, channel layers, barrier layers, and other layers are discussed by way of example in U.S. Pat. No. 5,192,987, U.S. Pat. No. 5,296,395, U.S. Pat. No. 6,316,793, U.S. Pat. No. 6,548,333, U.S. Pat. No. 7,544,963, U.S. Pat. No. 7,548,112, U.S. Pat. No. 7,592,211, U.S. Publication No. 2006/0244010, U.S. Publication No. 2007/0018210, and U.S. Publication No. 2007/0164322, the disclosures of which are hereby incorporated herein in their entirety by reference.

As further shown in FIG. 1, a photoresist lift-off mask 105 may be formed on semiconductor structure 103, exposing portions of semiconductor structure 103 where ohmic contacts will be formed. Then, layers of ohmic contact materials may be formed on photoresist lift-off mask 105 and on exposed portions of semiconductor structure 103 to provide the structure shown in FIG. 1. More particularly, a layer 107 of a first metal may be formed on photoresist lift-off mask 105 and on exposed portions of semiconductor structure 103b, and alternating layers 109 of silicon and a second metal may be formed on layer 107 of the first metal. In addition, a layer 111 of a third metal may be formed on alternating layers 109 of silicon and the second metal. By way of example, layer 107 may be a layer of titanium (Ti) and/or any other suitable metal, alternating layers 109 may be alternating layers of silicon (Si) and nickel (Ni) (and/or any other suitable metal), and layer 111 may be a layer of gold (Au), platinum (Pt), palladium (Pd) and/or any other suitable metal. Moreover, layer 107, alternating layers 109, and cap layer 111 may be formed in situ in a same reaction chamber, for example, by evaporation. In addition, semiconductor structure 103 may include doped source/drain regions 106 providing electrical coupling between respective layers 107 of the first metal and a 2 DEG at an interface between channel and barrier layers 103a and 103b. Doped source/drain regions 106, for example, may be doped to provide n-type conductivity.

Figure 5:
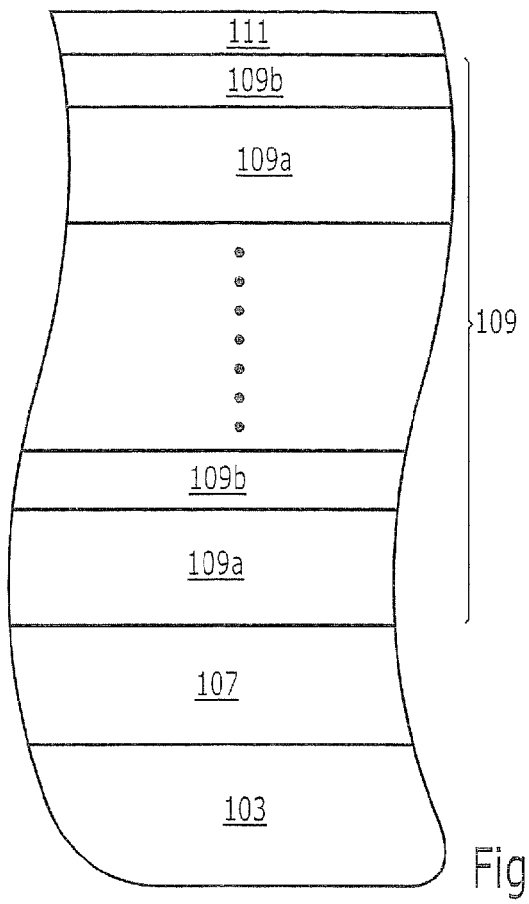
FIG. 5 is a greatly enlarged cross sectional view of an ohmic contact structure on a substrate as shown in FIGS. 1 and 2.

FIG. 5 is a greatly enlarged cross sectional view illustrating portions of layers 107, 109 and 111 on a portion of semiconductor structure 103. In particular, layer 107 of the first metal may be formed directly on a Group III semiconductor nitride layer (such as an AlGaN layer) of semiconductor structure 103, and alternating layers 109a of silicon and 109b of the second metal may be formed on layer 107 of the first metal. As shown in FIG. 5 a first of silicon layers 109a may separate all of layers 109b of the second metal from layer 107 of the first metal. More particularly, a first of silicon layers 109a may be directly on layer 107 of the first metal. According to some embodiments of the present invention, silicon layers 109a may be thicker than adjacent layers 109b of the second metal, and more particularly, thicknesses of silicon layers 109a may be about 2 times greater than thickness of adjacent layers 109b of the second metal.

According to particular embodiments of the present invention, layer 107 may be a layer of titanium, layers 109a may be layers of silicon, and layers 109b may be layers of nickel. Thicknesses of silicon layers 109a may be in the range of about 400 Angstroms to about 600 Angstroms and thicknesses of layers 109b of nickel may be in the range of about 200 Angstroms to about 300 Angstroms, and more particularly, thicknesses of silicon layers 109a may be about 500 Angstroms and thicknesses of layers 109b of nickel may be about 250 Angstroms. More generally, thickness of layers 109a and 109b may be selected to provide in the range of about 45 to about 55 atomic weight percent of silicon in the combination of alternating layers 109, and more particularly, in the range of about 48 to about 52 atomic weight percent of silicon. According to some embodiments of the present invention, thicknesses of layers 109a and 109b may be selected to provide about 50 atomic weight percent of silicon in the combination of alternating layers 109 of silicon and nickel.

Alternating layers 109a and 109b may include at least one layer 109a of silicon and at least one layer 109b of nickel to provide at least one pair of silicon and nickel layers 109a and 109b. According to some embodiments of the present invention, between two and ten pairs of silicon and nickel layers 109a and 109b may be included in stack 109, and according to particular embodiments, three or four pairs of silicon and nickel layers 109a and 109b may be provided. According to other embodiments of the present invention, at least two pairs of silicon and nickel layers 109a and 109b may be included. While pairs of silicon and nickel layers are shown by way of example, a last nickel layer may be omitted so that there is one more silicon layer than nickel layer. According to some embodiments of the presenting invention, a single layer 109b of the second metal may be sandwiched between two layers 109a of silicon.

In addition, a cap layer 111 may be provided on the alternating layers 109 so that the alternating layers 109 are sandwiched between cap layer 111 and titanium layer 107. Cap layer 111, for example, may be a layer of gold, palladium, and/or platinum, and cap layer 111 may have a thickness of less than about 500 Angstroms, and more particularly, in the range of about 50 Angstroms to about 200 Angstroms. According to other embodiments of the present invention, cap layer 111 may be omitted. Cap layer 111, for example, may reduce oxidation of alternating layers 109 and/or of a subsequently formed silicide.

Figure 2:
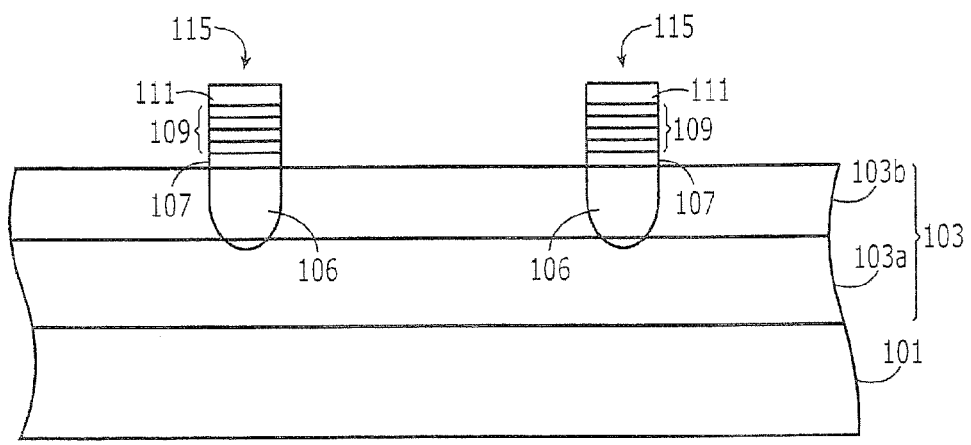

As shown in FIG. 2, photoresist lift-off mask 105 and portions of layers 107, 109, and 111 thereon may be removed. Accordingly, separate ohmic contact structures 115 (including respective layer 107 of the first metal, alternating layers 109, and cap layer 111) may remain on semiconductor structure 103 having the structure of FIG. 5. While lift-off patterning is discussed by way of example in FIGS. 1 and 2, ohmic contact structures 115 may be formed using other operations. For example, blanket layers 107, 109, and 111 may be formed directly on semiconductor structure 103 (i.e., without a photoresist lift-off mask), and then patterned using subsequent photolithographic masking and etch operations.

The alternating layers 109 may then be subjected to a thermal annealing operation to provide a contact structures 115' including silicide layer 109' of the second metal (e.g., nickel silicide and/or any other suitable metal silicide) on layer 107 of the first metal. More particularly, the thermal anneal may be performed at a temperature sufficient to form the silicide including the second metal (e.g., nickel and/or any other suitable metal) without forming significant silicide of the first metal (e.g., titanium and/or any other suitable metal). Moreover, by providing a first of silicon layers 109a between all of the layers 109b of the second metal and layer 107 of the first metal, mixing of the first and second metals during the thermal annealing operation may be reduced. By way of example, with a titanium layer 107 and nickel layers 109b, a rapid thermal anneal (RTA) may be performed at a temperature that does not exceed about 500 degrees C. to form nickel silicide without significant mixing of titanium and nickel and without significant formation of titanium silicide. The rapid thermal anneal, for example, may be performed at a temperature in the range of about 200 degrees C. to about 500 degrees C.

Moreover, by providing appropriate thicknesses of layers 109a and 109b as discussed above, an atomic weight percent of silicon in the resulting silicide layer 109' may be in the range of about 45 to about 55 atomic weight percent, and more particularly, the range of about 48 to about 52 atomic weight percent. According to some embodiments of the present invention, an atomic weight percent of silicon in the resulting silicide layer 109' may be about 50 atomic weight percent. Moreover, a composition of the metal silicide may be relatively uniform throughout a thickness of silicide layer 109'. In addition, cap layer 111 (if included) may reduce oxidation of alternating layers 109 and/or silicide layer 109' before/during/after the thermal annealing operation.

Figure 3:
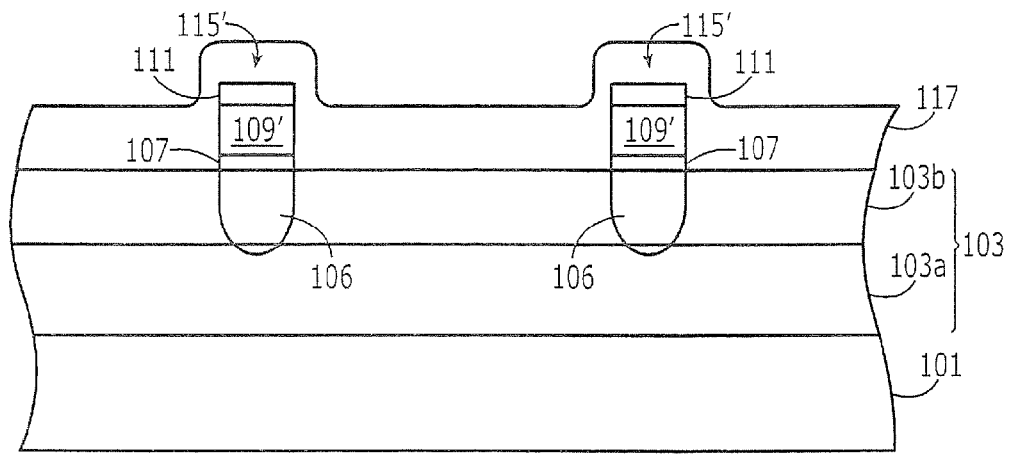

In addition, protective layer 117 may be formed on contact structures 115' before or after the thermal anneal operation as further shown in FIG. 3. Protective layer 117, for example, may be a layer of an insulating material such as silicon nitride ($Si_xN_y$), aluminum nitride (AlN), silicon dioxide ($SiO_2$), and/or other suitable protective material. Other materials may also be used for the protective layer 117. For example, protective layer 117 may also include magnesium oxide, scandium oxide, aluminum oxide and/or aluminum oxynitride. Furthermore, protective layer 117 may be a single layer or may include multiple layers of uniform and/or non-uniform composition.

While cap layer 111 is shown after forming protective layer 117 in FIG. 3 by way of example, cap layer 111 may be removed after the thermal anneal operation and before forming protective layer 117. Moreover, protective layer 117 may be omitted altogether as discussed above.

Figure 4:
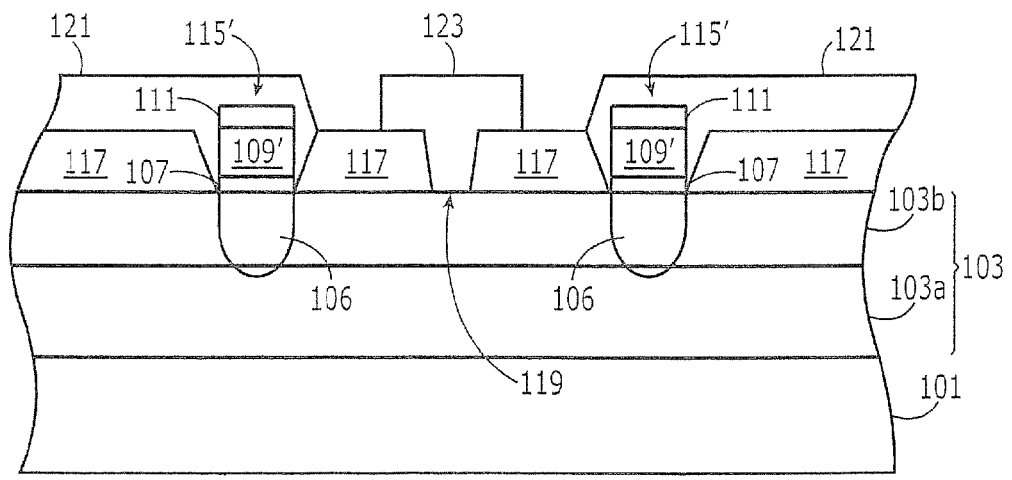

Protective layer 117 may then be patterned using photolithographic mask and etch operations as shown in FIG. 4 to expose contact structures 115' and to expose a gate contact area 119 of semiconductor structure 103. Source/drain electrodes 121 and gate electrode 123 may then be formed as further shown in FIG. 4. According to some embodiments of the present invention, source/drain electrodes 121 and gate electrode 123 may be formed at the same time using a same material such as gold and/or any other suitable metal. For example, a blanket layer of a metal (e.g., gold and/or any other suitable metal) may be deposited and then patterned using subsequent photolithographic mask and etch operations to form source/drain electrodes 121 and gate electrode 123. According to other embodiments of the present invention, gate electrode 123 (or portions thereof) may be formed separately from source/drain electrodes 121 so that gate electrode 123 and source/drain electrodes may comprise different materials. While gold is discussed by way of example as a gate electrode material, other materials, such as nickel, platinum, nickel silicide, copper, palladium, chromium, tungsten, tungsten silicon nitride, and/or any other suitable conductive material may be used for gate electrode 123. According to some embodiments of the present invention, portions of gate electrode 123 may directly contact semiconductor structure 103 to provide a Schottky or otherwise non-ohmic contact therebetween. Accordingly, a material of gate electrode 123 may be selected to provide such a Schottky or other non-ohmic contact with gate contact area 119 of semiconductor structure 103.

According to some embodiments of the present invention, gate electrode 123 may be formed, and then a layer of metal for source/drain electrodes 121 may be formed/patterned to provide source/drain electrodes 121. While not shown in FIG. 4, an insulating layer may be formed on gate electrode 123, on ohmic contacts 115', and on protective layer 117. This insulating layer may be patterned to expose portions of ohmic contacts 115', and then source/drain electrodes 121 may be formed on this insulating layer and on exposed portions of respective ohmic contacts 115'.

As shown in FIG. 4, cap layers 111 may be maintained on ohmic contacts 115' after forming source/drain electrodes 121. According to other embodiments of the present invention, cap layers 111 may be removed after patterning protective layer 117 and before forming source/drain electrodes 121. According to still other embodiments of the present invention, cap layer 111 may be removed prior to forming protective layer 117 or omitted altogether as discussed above with respect to FIGS. 1-3.

The HEMT of FIG. 4 may thus provide conduction between ohmic contacts 115' through a 2-dimensional electron gas (2 DEG) at an interface between channel layer 103a and barrier layer 103b. Moreover, conduction through the 2 DEG between ohmic contacts 115' may be modulated responsive to an electrical signal applied to gate electrode 123.

Ohmic contact structures and methods of fabrication have been discussed above by way of example with respect to Group III nitride semiconductor HEMT structures. Ohmic contact structures and methods according to embodiments of the present invention may be used with other semiconductor devices and/or materials. Ohmic contact structures and methods according to other embodiments of the present invention, for example, may be used with MOSFET transistors, with bipolar junction transistors, with light emitting diodes, etc. Moreover, ohmic contact structures and methods according to embodiments of the present invention may be used with horizontal devices having all contacts on a same side/face of the device as discussed above with respect to FIGS. 1-4 or with vertical devices having contacts on opposite sides/faces of the device.

Figure 6:
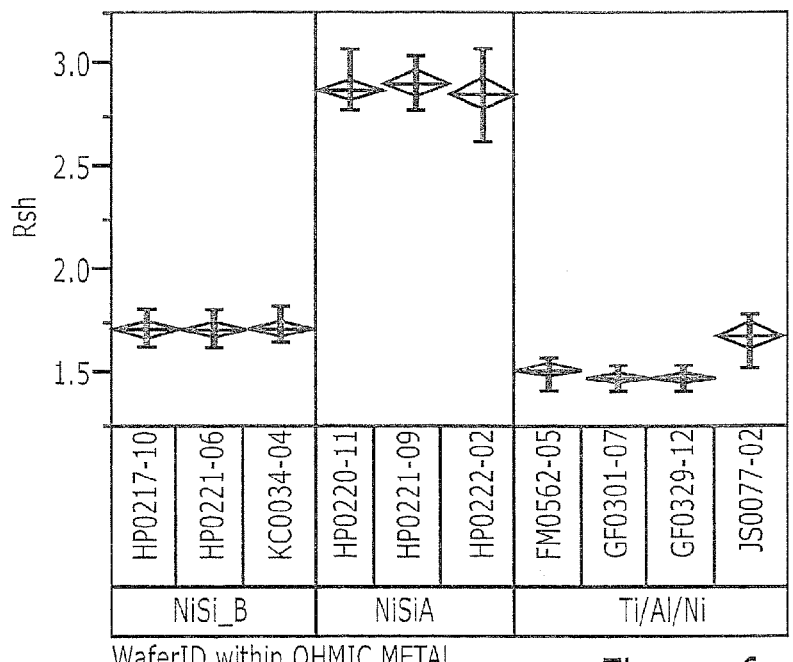
FIG. 6 is a graph illustrating sheet resistances of ohmic contact structures.

FIG. 6 is a graph illustrating average sheet resistances (measured in ohms/square) and ranges thereof for ohmic contact structures fabricated on different wafers. The NiSi_B group includes three wafers (HP0217-10, HP0221-06, and KC0034-04) provided with ohmic contact structures formed according to embodiments of the present invention as shown in FIGS. 1-5, with each ohmic contact structure including a titanium layer and a silicide layer formed by annealing three layers of silicon (each having a thickness of about 500 Angstroms) alternating with three layers of nickel (each having a thickness of about 250 Angstroms). The NiSiA group includes three wafers (HP0220-11, HP0221-09, and HP0222-02) provided with ohmic contact structures formed according to embodiments of the present invention as shown in FIGS.

1-5, with each ohmic contact structure including a titanium layer and a silicide layer formed by annealing two layers of silicon (each having a thickness of about 500 Angstroms) alternating with two layers of nickel (each having a thickness of about 250 Angstroms). The Ti/Al/Ni comparison group includes four wafers (FM0562-05, GF0301-07, GF0329-12, and JS0077-02) provided with ohmic contact structures, with each ohmic contact structure formed from layers including a titanium layer, an aluminum layer, and a nickel layer.

As shown in the graph of FIG. 6, resistances of ohmic contact structures of the NiSi_B group according to embodiments of the present invention and the Ti/Al/Ni comparison group may be statistically very similar. As noted above, however, ohmic contact structures including silicides formed by annealing alternating layers of silicon and nickel may provide increased resistance to damage from subsequent etch operations, reduced damage from corrosion, and/or improved adhesion.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a semiconductor device, the method comprising:
   providing a semiconductor layer;
   providing a first layer of a first metal on the semiconductor layer;
   providing a second layer on the first layer of the first metal, wherein the second layer includes a layer of silicon and a layer of a second metal, and wherein the first and second metals are different, wherein the layer of silicon comprises at least two layers of silicon and wherein the layer of the second metal comprises at least one layer of the second metal separating the at least two layers of silicon; and
   annealing the second layer including the at least two layers of silicon and the at least one layer of the second metal, such that the annealing forms a silicide layer including the second metal while maintaining at least a portion of the first layer of the first metal between the silicide layer and the semiconductor layer.

2. A method according to claim 1 wherein at least one of the layers of silicon is between the layer of the second metal and the first layer of the first metal.

3. A method according to claim 1 wherein the first metal comprises titanium and the second metal comprises nickel.

4. A method according to claim 1 wherein the first metal comprises titanium, wherein the second metal comprises nickel, and wherein annealing the at least two layers of silicon and the at least one layer of the second metal comprising nickel to form the silicide layer comprises annealing at a temperature that does not exceed about 500 degrees C.

5. A method according to claim 1 wherein providing the second layer comprises providing a plurality of alternating layers of silicon and the second metal, wherein all of the layers of the second metal are separated from the first layer of the first metal by at least one of the layers of silicon.

6. A method according to claim 1 further comprising:
   providing a metal cap layer on the second layer including the at least two layers of silicon and the at least one layer of the second metal wherein the metal cap layer and the second metal comprise different materials.

7. A method according to claim 6 wherein the first metal comprises titanium, the second metal comprises nickel, and the metal cap layer comprises at least one of platinum, palladium, and/or gold.

8. A method according to claim 1 wherein providing the semiconductor layer comprises,
   providing a group III nitride heterojunction structure providing a 2-dimensional electron gas, and
   providing a doped region providing electrical coupling between the layer of the first metal and the 2-dimensional electron gas.

9. A method according to claim 1 wherein the first metal comprises titanium, wherein the second metal comprises nickel, and wherein an atomic weight percent of silicon in the second layer is in the range of about 45 percent to about 55 percent, the method further comprising:
   providing a metal cap layer on the second layer wherein the metal cap layer comprises at least one of platinum, palladium, and/or gold.

10. A method of forming a semiconductor device, the method comprising:
    providing a group III nitride semiconductor layer;
    providing a layer of a first metal on the group III nitride semiconductor layer wherein the first metal comprises titanium; and
    providing a silicide layer on the layer of the first metal, wherein the silicide layer includes a second metal and the second metal comprises nickel, such that providing the silicide layer comprises maintaining at least a portion of the first metal layer between the silicide layer and the group III nitride semiconductor layer after providing the silicide layer.

11. A method according to claim 10 further comprising:
    providing a layer of a third metal on the silicide layer wherein the third metal is different that the first and second metals.

12. A method according to claim 11 wherein the third metal comprises at least one of platinum, palladium, and/or gold.

13. A method according to claim 10 wherein providing the group III semiconductor nitride layer comprises,
    providing a group III nitride heterojunction structure providing a 2-dimensional electron gas, and
    providing a doped region providing electrical coupling between the layer of the first metal and the 2-dimensional electron gas.

14. A method according to claim 10 wherein providing the silicide layer comprises,
    providing at least two layers of silicon and a layer of the second metal on the layer of the first metal wherein the layer of the second metal separates the at least two layers of silicon, and
    annealing the at least two layers of silicon and the layer of the second metal, such that the annealing forms the silicide layer including the second metal while maintaining at least a portion of the first layer of the first metal between the silicide layer and the semiconductor layer, wherein annealing to form the silicide layer comprises annealing at a temperature that does not exceed about 500 degrees C.

15. A method according to claim 10 wherein an atomic weight percent of silicon in the silicide layer is in the range of about 45 percent to about 55 percent, the method further comprising:
    providing a metal cap layer on the silicide layer wherein the metal cap layer comprises at least one of platinum, palladium, and/or gold.

16. A semiconductor device comprising:
a semiconductor layer;
a first layer of a first metal on the semiconductor layer wherein the first metal comprises titanium;
a second layer on the first layer of the first metal, wherein the second layer includes a layer of silicon and a layer of a second metal, and wherein the first and second metals are different, wherein the layer of silicon comprises at least two layers of silicon and wherein the layer of the second metal comprises at least one layer of the second metal separating the at least two layers of silicon, wherein the second metal comprises nickel, and wherein an atomic weight percent of silicon in the second layer is in the range of about 45 percent to about 55 percent; and
a metal cap layer on the second layer wherein the metal cap layer comprises at least one of platinum, palladium, and/or gold.

17. A semiconductor device according to claim 16 wherein at least one of the layers of silicon is between the at least one layer of the second metal and the first layer of the first metal.

18. A semiconductor device according to claim 16 wherein the first metal comprises titanium and the second metal comprises nickel.

19. A semiconductor device according to claim 16 wherein all of the layers of the second metal are separated from the layer of the first metal by at least one of the layers of silicon.

20. A semiconductor device according to claim 16 wherein an atomic weight percent of silicon in the second layer is in the range of about 45 percent to about 55 percent.

21. A semiconductor device according to claim 16 further comprising:
a metal cap layer on the second layer wherein a metal of the metal cap layer is different than the first and second metals.

22. A semiconductor device according to claim 21 wherein the first metal comprises titanium, the second metal comprises nickel, and the metal cap layer comprises at least one of platinum, palladium, and/or gold.

23. A semiconductor device according to claim 16 wherein the semiconductor layer comprises,
a group III nitride heterojunction structure providing a 2-dimensional electron gas, and
a doped region providing electrical coupling between the layer of the first metal and the 2-dimensional electron gas.

24. A semiconductor device comprising:
a group III nitride semiconductor layer;
a layer of a first metal on the group III nitride semiconductor layer wherein the first metal comprises titanium; and
a silicide layer on the layer of the first metal, wherein the silicide layer includes a second metal, wherein the layer of the first metal is between the silicide layer and the group III nitride semiconductor layer, and wherein the second metal comprises nickel.

25. A semiconductor device according to claim 24 further comprising:
a layer of a third metal on the silicide layer wherein the third metal is different than the first and second metals.

26. A semiconductor device according to claim 25 wherein the third metal comprises at least one of platinum, palladium, and/or gold.

27. A semiconductor device according to claim 24 wherein the group III nitride semiconductor layer comprises,
a group III nitride heterojunction structure providing a 2-dimensional electron gas, and
a doped region providing electrical coupling between the layer of the first metal and the 2-dimensional electron gas.

28. A semiconductor device according to claim 24 wherein an atomic weight percent of silicon in the silicide layer is in the range of about 45 percent to about 55 percent.

29. A semiconductor device according to claim 24 wherein an atomic weight percent of silicon in the silicide layer is in the range of about 45 percent to about 55 percent, the device further comprising:
a metal cap layer on the silicide layer wherein the metal cap layer comprises at least one of platinum, palladium, and/or gold.

30. A method of forming a semiconductor device, the method comprising:
providing a group III nitride semiconductor layer;
providing a layer of a first metal on the group III nitride semiconductor layer; and
providing a silicide layer on the layer of the first metal, wherein the silicide layer includes a second metal, wherein the first metal comprises titanium, wherein the second metal comprises nickel, and wherein an atomic weight percent of silicon in the silicide layer is in the range of about 45 percent to about 55 percent; and
providing a metal cap layer on the silicide layer wherein the metal cap layer comprises at least one of platinum, palladium, and/or gold.

* * * * *